(12) United States Patent
Chang et al.

(10) Patent No.: US 8,047,668 B2
(45) Date of Patent: Nov. 1, 2011

(54) DISPLAY DEVICE, BACKLIGHT MODULE OF SUCH DISPLAY DEVICE, AND METHOD OF FIXING CIRCUIT BOARD ON SUCH BACKLIGHT MODULE

(75) Inventors: Chih-Jen Chang, Tainan County (TW); Shun-Nan Chang, Tainan County (TW)

(73) Assignee: Chimei Innolux Corporation, Miao-Li County (TW)

( * ) Notice: Subject to any disclaimer, the term of this patent is extended or adjusted under 35 U.S.C. 154(b) by 255 days.

(21) Appl. No.: 12/392,213

(22) Filed: Feb. 25, 2009

(65) Prior Publication Data
US 2009/0213574 A1 Aug. 27, 2009

(30) Foreign Application Priority Data

Feb. 26, 2008 (TW) .............................. 97106693 A (51) Int. Cl.
*G09F 13/04* (2006.01)
*G09F 13/08* (2006.01)
(52) U.S. Cl. .. 362/97.1; 362/631; 362/561; 362/217.11; 362/217.17
(58) Field of Classification Search ................ 362/630, 362/631, 608, 609, 591, 97.1–97.4, 362, 362/632, 633, 634, 217.11–217.13, 217.15–217.17, 362/612, 249.02, 249.11; 349/58, 67; 359/58
See application file for complete search history.

(56) References Cited

U.S. PATENT DOCUMENTS

| | | | |
|---|---|---|---|
| 5,666,172 A * | 9/1997 | Ida et al. | 349/58 |
| 6,490,016 B1 * | 12/2002 | Koura | 349/58 |
| 2008/0088764 A1 * | 4/2008 | Son et al. | 349/58 |
| 2009/0122476 A1 * | 5/2009 | Won et al. | 361/679.21 |

* cited by examiner

*Primary Examiner* — Anabel Ton
*Assistant Examiner* — Danielle Allen
(74) *Attorney, Agent, or Firm* — Lowe Hauptman Ham & Berner LLP (57) ABSTRACT

A backlight module includes at least one light source, a lamp cover and a circuit board. The lamp cover has a containing portion and at least one projection. The containing portion is arranged for containing the light source. The projection is located at an outer side of the containing portion on which the circuit board is placed so that at least one fixing portion of the circuit board is in contact with the projection for constraining movements of the circuit board relative to the lamp cover.

20 Claims, 11 Drawing Sheets

DISPLAY DEVICE, BACKLIGHT MODULE OF SUCH DISPLAY DEVICE, AND METHOD OF FIXING CIRCUIT BOARD ON SUCH BACKLIGHT MODULE

This application claims the benefit of Taiwan application Serial No. 97106693, filed Feb. 26, 2008, the subject matter of which is entirely incorporated herein by reference.

BACKGROUND

The disclosure relates, in general, to a display device, a backlight module and a method of fixing a circuit board on such a backlight module, and more particularly, to a display device using a side type backlight module and a method of fixing a circuit board on such a backlight module.

Along with the rapid advance in the technology of manufacturing flat display panels, which possess various advantages, such as lightweight, small volume, low power consumption and low or zero radiation, flat display panels have now been widely used in various electronic products such as personal digital assistants (PDA), notebook computers, digital cameras, mobile phones, computer screens and flat TVs. As the industry puts emphasis on research and development and adopts large-scale production, the quality of flat display panels has been improved and the price keeps dropping, and the area of application is rapidly expanded.

Figure 1A:
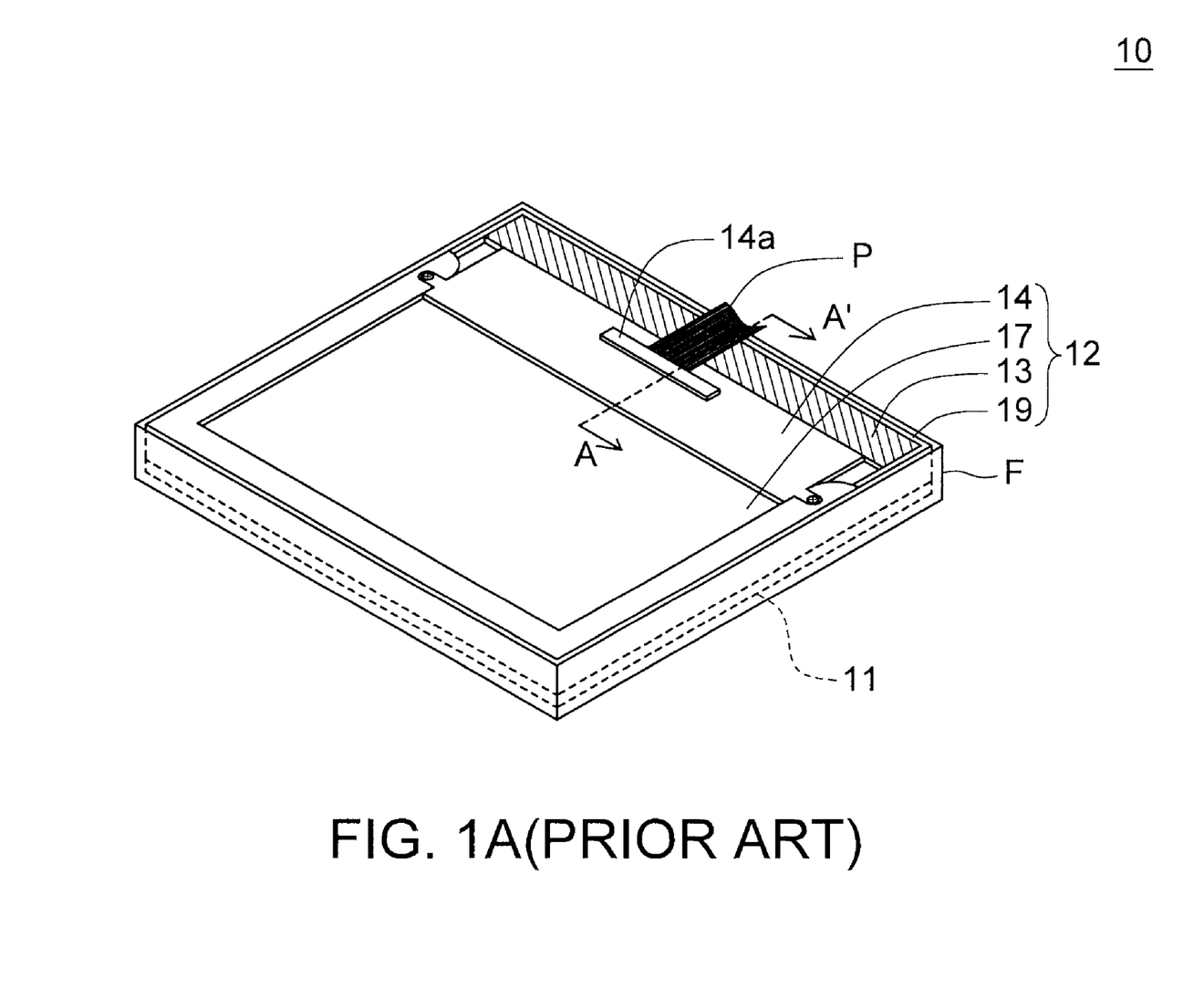
FIG. 1A shows a schematic, perspective view of a known display device.
Figure 1B:
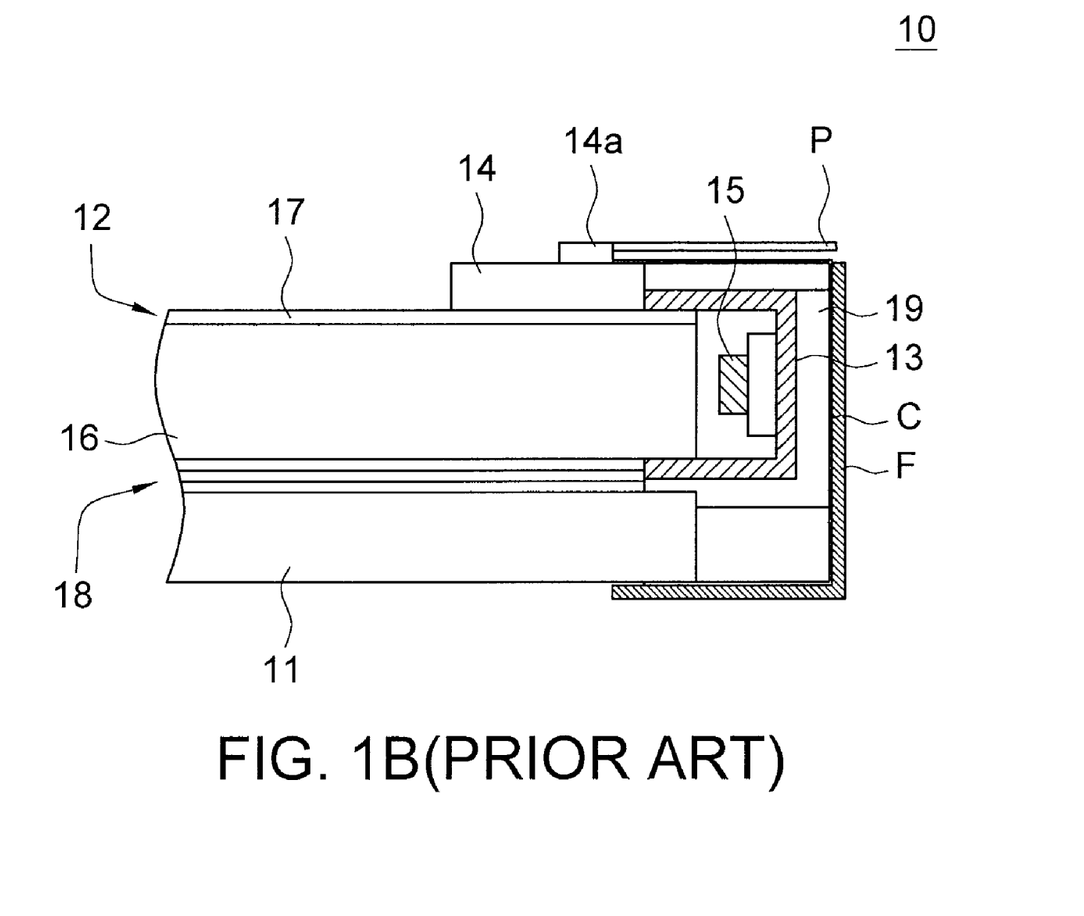
FIG. 1B shows a cross-sectional view of the display device of FIG. 1A taken along a cross-sectional line A-A'.

Generally speaking, a display device using a flat display panel has a circuit board, which is connected to the display panel and/or other external circuits via a cable. According to a method known to the inventor(s) for fixing the circuit board, the circuit board is fixed on a plastic housing by screws or adhesive, and the backlight module and the display panel are disposed in a front iron frame. To further reduce the thickness of the backlight module of the display device, the plastic housing only surrounds the backlight module so that the circuit board is directly located on the reflector. FIG. 1A shows a schematic, perspective view of a display device known to the inventor(s), and FIG. 1B shows a cross-sectional view of the display device of FIG. 1A taken along a cross-sectional line A-A'. The display device 10 includes a front iron frame F, a display panel 11 and a backlight module 12. The display panel 11 is disposed at one side of the backlight module 12. The display panel 11 and the backlight module 12 are contained in the front iron frame F. The backlight module 12 includes a plastic housing 19, a lamp cover 13, a circuit board 14, a reflector 17, a light guide plate 16, a light source 15 and multi-layered optical sheets 18. The reflector 17 is disposed at one side of the light guide plate 16. The multi-layered optical sheets 18 are disposed at the other side of the light guide plate 16 and opposite to the reflector 17. The lamp cover 13 is adjacent to the light guide plate 16, and located at one side of the light guide plate 16 for containing the light source 15, and receiving a part of the reflector 17 and the light guide plate 16. The circuit board 14 is disposed at the side of the light guide plate 16 opposite to the display panel 11, and is connected to the display panel 11 through the flexible circuit board C. The plastic housing 19 surrounds the reflector 17 and the light guide plate 16 so as to further reduce the thickness of the backlight module 12. As the circuit board 14 is directly located on the reflector 17, the circuit board 14 can only be fastened, e.g., by screws, on the plastic housing 19 from the two sides. When the cable P is plugged into a connector 14a of the circuit board 14 or unplugged from the connector 14a, the circuit board 14 may move relatively to the plastic housing 19 if the screw(s) is/are not fastened properly. As a result, the circuit board 14 may be tilted or bent, not only making the connector 14a easily prone to damage and creating a poor contact between the cable P and the circuit board 14, but also affecting the product quality.

SUMMARY

According to a first aspect, a display device comprises: a display panel; a circuit board electrically connected to the display panel and having at least one fixing portion; and a backlight module disposed at one side of the display panel. The backlight module comprises: at least one light source; a lamp cover having an inner surface and an outer surface, and at least one protruding portion located at the outer surface. The at least one light source is surrounded by the inner surface of the lamp cover. The circuit board is disposed on the outer surface of the lamp cover so that the at least one protruding portion is in contact with the at least one fixing portion for constraining movements of the circuit board relative to the lamp cover.

According to a second aspect, a method of fixing a circuit board on a backlight module comprises providing a lamp cover having at least one protruding portion and a containing portion. The containing portion is arranged for containing, at an inner side thereof, at least one light source of the backlight module. The at least one protruding portion is located at an outer side of the containing portion. At least one fixing portion is provided on the circuit board. The circuit board is placed on the outer side of the containing portion so that the at least one fixing portion is in contact with the at least one the protruding portion to constrain movements of the circuit board relative to the lamp cover.

According to a third aspect, a backlight module for a display device comprises at least one light source; a lamp cover having an inner surface and an outer surface, wherein the at least one light source is surrounded by the inner surface; at least one protruding portion located at the outer surface; and a circuit board disposed on the outer surface of the lamp cover and having at least one fixing portion in contact with the at least one protruding portion which constrains movements of the circuit board relative to the lamp cover.

DETAILED DESCRIPTION

Reference will now be made in detail to several embodiments, examples of which are illustrated in the accompanying drawings. Wherever possible, the same reference numbers are used in the drawings and the description to refer to the same or like parts. The embodiments are specifically described for exemplary purposes only, and the scope of the instant disclosure is not limited to the specifically disclosed embodiments. Moreover, certain elements are omitted in the drawings and/or description for the sake of simplicity.

First Configuration

According to the display device in the first configuration, at least one fixing column is disposed on the carrying portion of the lamp cover, and at least one fixing hole is disposed on the circuit board. As the fixing column is inserted into the fixing hole and is hence engaged with the fixing hole, the circuit board is fixed on the lamp cover, and the problems occurring when the circuit board is moved relatively to the lamp cover are avoidable.

Figure 2:
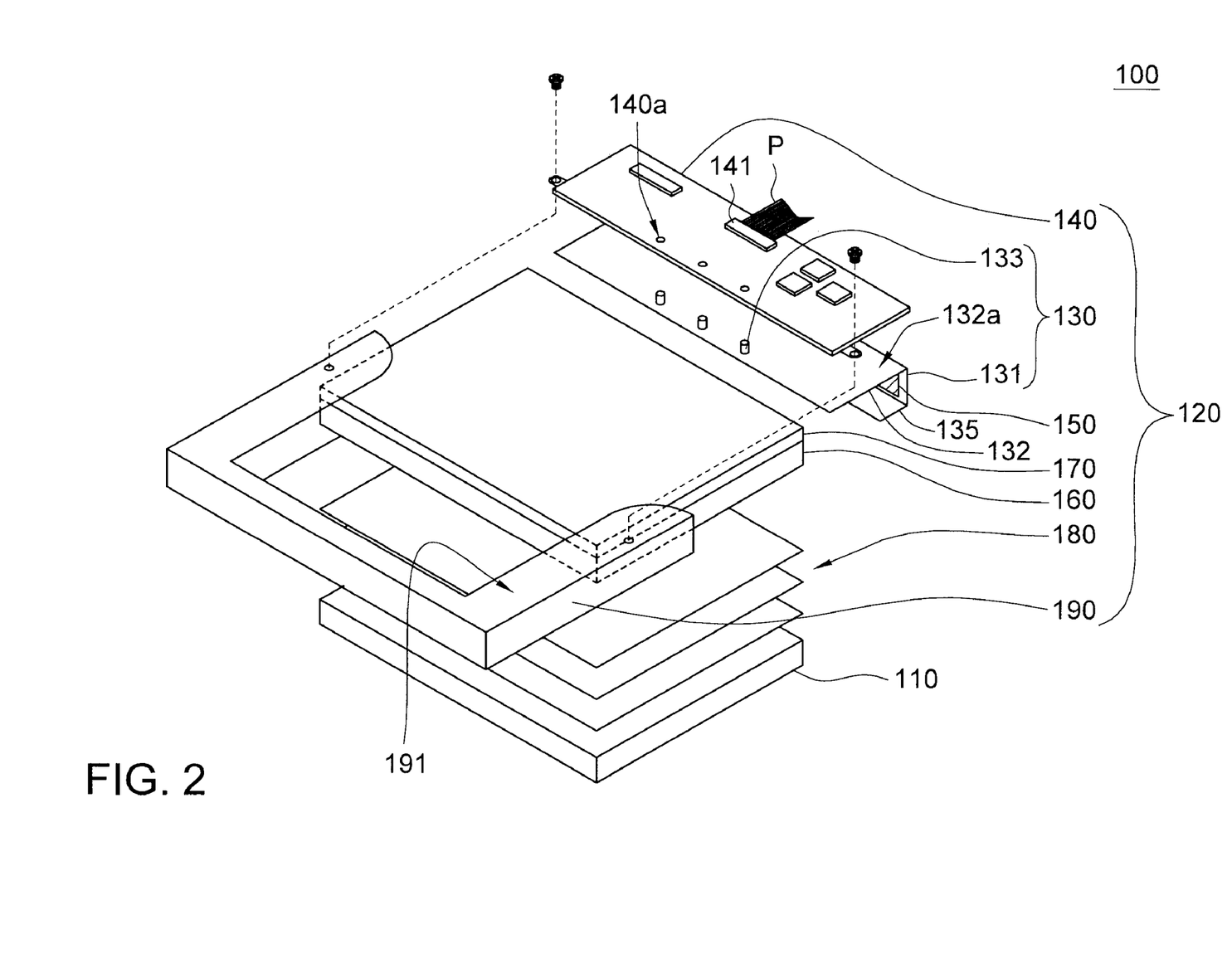
FIG. 2 shows an exploded, schematic, perspective view of a display device according to one or more embodiments.

In FIG. 2, an exploded, schematic, perspective view of a display device according to an embodiment is shown. The display device 100 mainly includes a display panel 110 and a backlight module 120. The backlight module 120, disposed at one side of the display panel 110, includes at least one light source 150, a circuit board 140 and a fixing structure 130. The circuit board 140 has at least one fixing hole 140a. The fixing structure 130 for positioning the circuit board 140 includes a lamp cover 131 and at least one fixing column 133. The lamp cover 131 has a containing portion 135 and a carrying portion 132. The containing portion 135 is arranged for containing the light source 150. The carrying portion 132 has an outer surface 132a facing the outside of the lamp cover 131. The fixing column 133, disposed on the outer surface 132a, is engaged with the fixing hole 140a for fastening the circuit board 140 on the outer surface 132a.

Furthermore, as the circuit board 140 is disposed on the carrying portion 132, the circuit board 140 is correspondingly located above the light source 150. That is, the circuit board 140, the lamp cover 131 and the light source 150 are located at the same side of the display device 100. Besides, the circuit board 140 includes a connector 141 coupled to a cable P. The circuit board 140 is electrically connected to the display panel 110 or an external circuit (not shown) of the backlight module 120 through the cable P. The cable P only covers a part of the circuit board 140. Furthermore, the circuit board 140 is connected to the display panel 110 through a flexible printed circuit board (not shown) using chip on film (COF) technology.

As shown in FIG. 2, the backlight module 120 further includes a light guide plate (LGP) 160, a reflector 170 and at least one optical sheet 180. The light guide plate 160 is disposed at one side of the lamp cover 131. The light emitted by the light source 150 enters the light guide plate 160. The optical sheet 180, disposed between the light guide plate 160 and the display panel 110, is a diffuser plate and/or a brightness enhancement film (BEF), for example. The reflector 170 is disposed at the other side of the light guide plate 160 and opposite to the optical sheet 180. The lamp cover 131 is a side U-shaped or C-shaped structure with an opening. The light guide plate 160 is correspondingly disposed beside the opening of the lamp cover 131, so that the light emitted by the light source 150 can enter the light guide plate 160 through the opening of the lamp cover 131.

The backlight module 120 further includes a frame 190 as shown in FIG. 2. The frame 190, at least partly surrounding the reflector 170 and the light guide plate 160, has a connecting surface 191 substantially parallel to the carrying portion 132. The circuit board 140 is fastened on the connecting surface 191 by one or more screw(s), for example, so that the circuit board 140 is fixed on the frame 190 and is further firmly fixed on the backlight module 120 by engaging the fixing column 133 with the fixing hole 140a. However, the circuit board 140 can also be fixed on the connecting surface 191 by adhering or other methods.

Figure 3A:
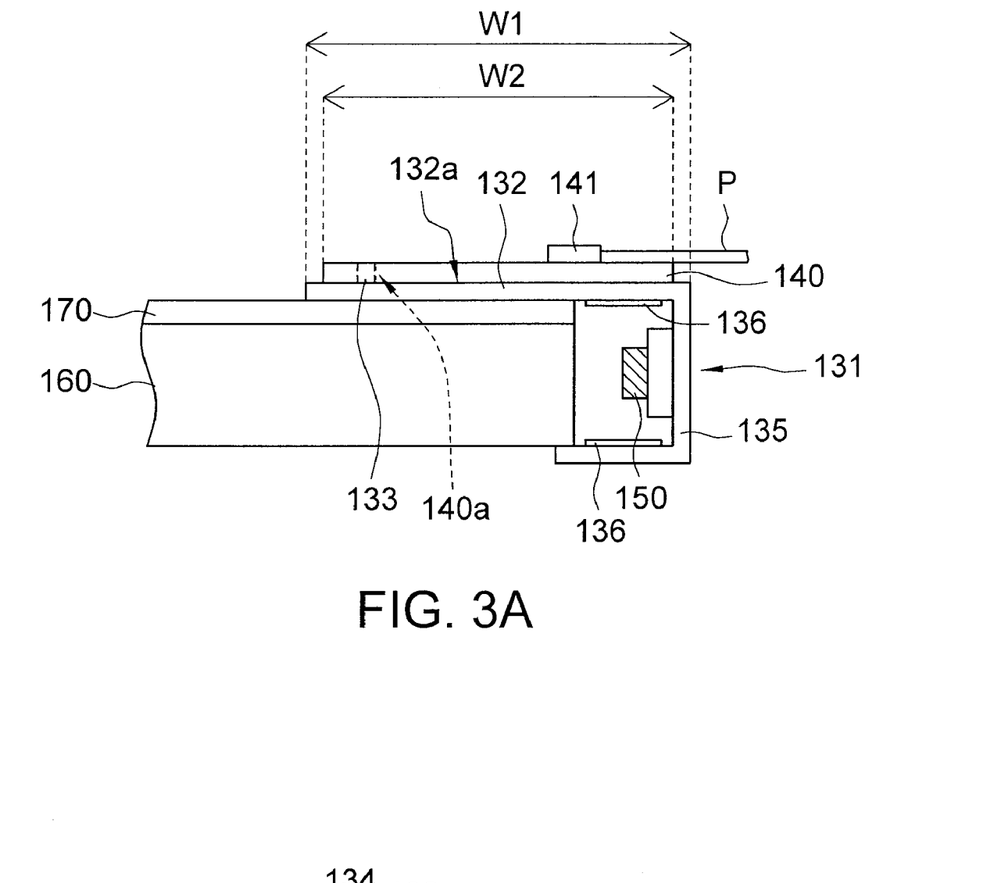
FIG. 3A shows a fixing structure of FIG. 2.

In FIG. 3A, a fixing structure of FIG. 2 is shown. The carrying portion 132 is substantially a plane. The circuit board 140, parallel to the carrying portion 132, is flatly laid on the carrying portion 132 with its back facing the outer surface 132a. In the illustrated embodiment, the width w1 of the carrying portion 132 is substantially larger than the width w2 of the circuit board 140. That is, the area of the lamp cover 131 of the illustrated embodiment is larger than the area of the circuit board 140 so that the carrying portion 132 has a sufficient area to effectively transmit the heat generated by the light source 150 and the circuit board 140. Thus, the overall efficiency in heat dissipation by the backlight module 120 is improved, so that thermal defects (such as non-uniformed luminance on the frame) will be less likely to occur in the display device 100. However, the width w1 of the carrying portion 132 can be substantially equal to the width w2 of the circuit board 140 in some embodiments, so that the area of the carrying portion 132 is substantially equal to the area of the circuit board 140. Moreover, the fixing structure 130 includes, for example, one or more light sources 150 such as LEDs. The LEDs can be disposed on a bar-shaped substrate to constitute a light bar such that the uniformity in luminance is increased. In other embodiments, the light source 150 is not limited to LEDs, and any other light sources usable in a side type backlight module can also be used.

Examples of the material of the lamp cover 131 in some embodiments include metallic materials such as aluminum or stainless steel or other materials with desired heat conductivity and mechanical strength. The lamp cover 131 provides sufficient mechanical strength to prevent the light source 150 from being pressed or damaged during the assembly, testing or transportation of the display device 100 and to maintain the circuit board 140 evenly laid on the carrying portion 132, so that the circuit board 140 will be unlikely curled up or distorted. If the lamp cover 131 is made from a material with excellent heat conductivity, the backlight module 120 will provide even better efficiency in heat dissipation. Besides, the lamp cover 131 further has at least a reflective piece 136 located at an inner side of the containing portion 135 and facing the light source 150 for reflecting the light emitted by the light source 150 so as to increase the light flux of the light guide plate 160. As shown in FIG. 3A, the lamp cover 131 has at least two reflective pieces 136 respectively disposed on the top surface and the bottom surface inside the containing portion 135.

Figure 3B:
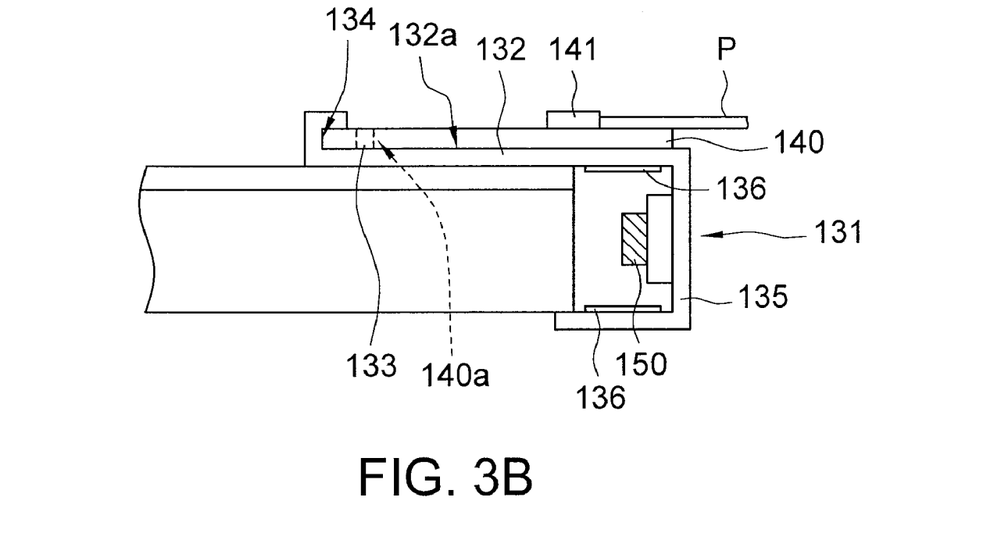
FIG. 3B shows a fixing structure with a lamp cover having a recess according to one or more embodiments.

The fixing structure 130 in some embodiments further includes a recess 134 disposed on the carrying portion 132. In FIG. 3B, an exploded, schematic, perspective view of a lamp cover having a recess 134 according to such an embodiment is shown. The recess 134 in the illustrated embodiment is formed as the terminal of the carrying portion 132 which is distant from the light source 150 and which is bent toward the circuit board 140. The opening of recess 134 faces the circuit board 140. When the circuit board 140 is engaged with the fixing hole 140a through the fixing column 133 and is firmly fixed on the outer surface 132a, one end of the circuit board 140 is contained in the recess 134 and is in contact with or rests on the inner surface of the recess 134. Thus, the circuit board 140 will be prevented from moving along a direction perpendicular to the carrying portion 132, so that the circuit board 140 is tightly laid on the outer surface 132a and will not come off easily. Meanwhile, the heat generated by the circuit board 140 is uniformly and quickly transmitted to the lamp cover 131.

Figure 4:
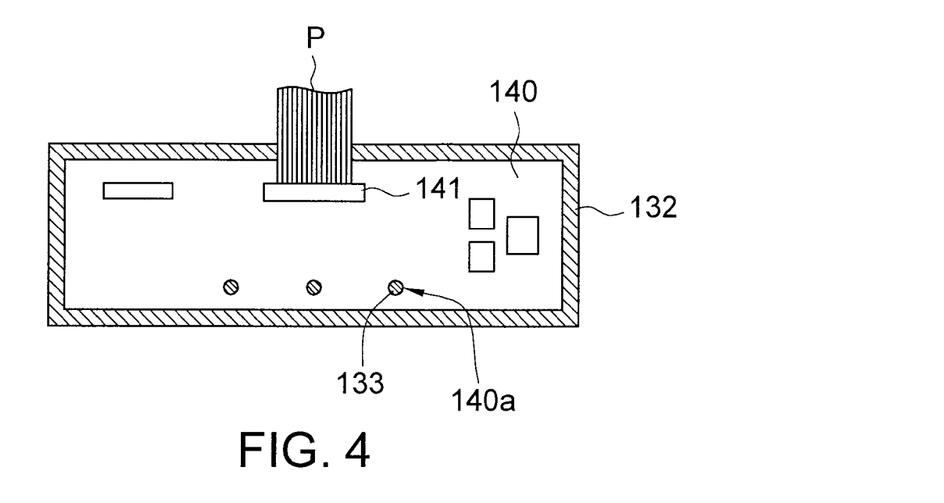
FIG. 4 shows an arrangement of a fixing hole and a fixing column in a fixing structure in accordance with one or more embodiments.

The arrangement of the fixing hole and the fixing column in some embodiments is disclosed below in details. In FIG. 4, an arrangement of the fixing hole and the fixing column in accordance with such an embodiment is shown. In the embodiment illustrated in FIG. 4, the circuit board 140 has three fixing holes 140a, and the fixing structure 130 includes three fixing columns 133. The fixing holes 140a are disposed along an edge of the carrying portion 132 opposite to the cable P, and the shape and dimension of the fixing holes 140a substantially correspond to those of the fixing columns 133, so that the fixing columns 133 respectively contact the side wall of the fixing holes 140a, and the fixing column 133 are firmly engaged or positively fit in the fixing hole 140a. Thus, it is assured that the circuit board 140 will be prevented from moving on the carrying portion 132, and the connector 141 will not be easily damaged by movements of the circuit board 140 when the cable P is plugged or unplugged by a force. Other arrangements, e.g., where the fixing columns are snap-fit in the fixing holes, are, however, not excluded.

Figure 5A:
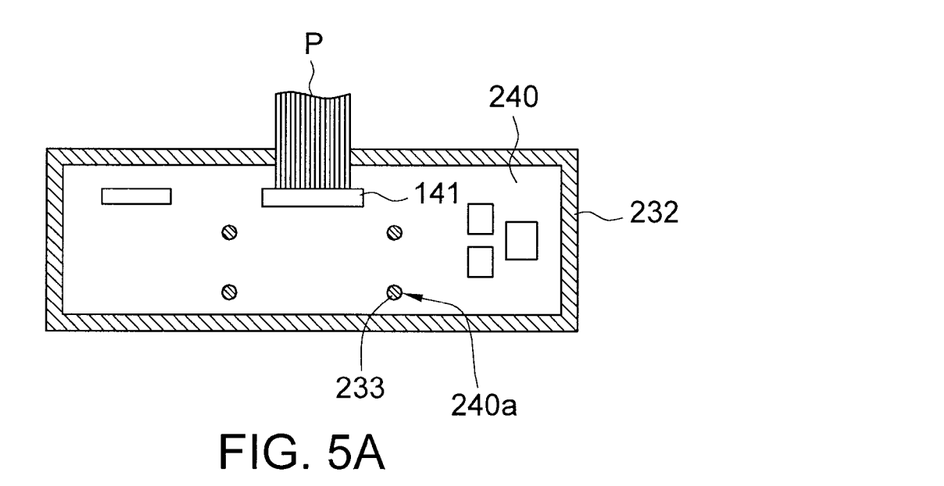
FIGS. 5A~5D respectively show various arrangements of the fixing column and the fixing hole in accordance with further embodiments.
Figure 5B:
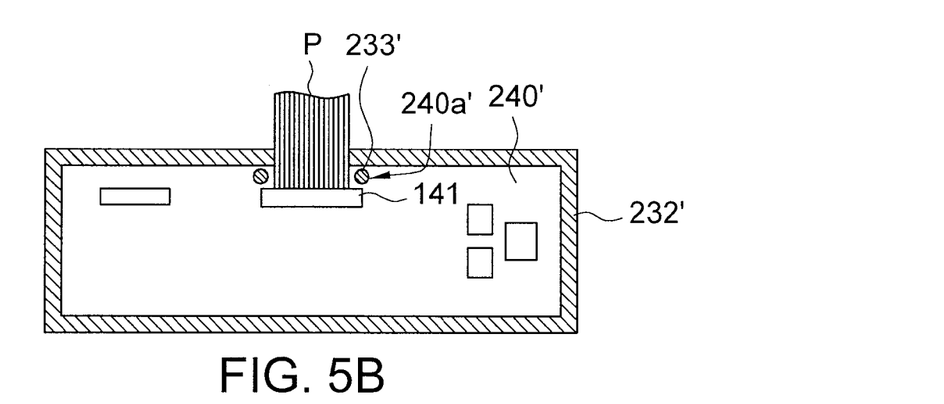
Figure 5C:
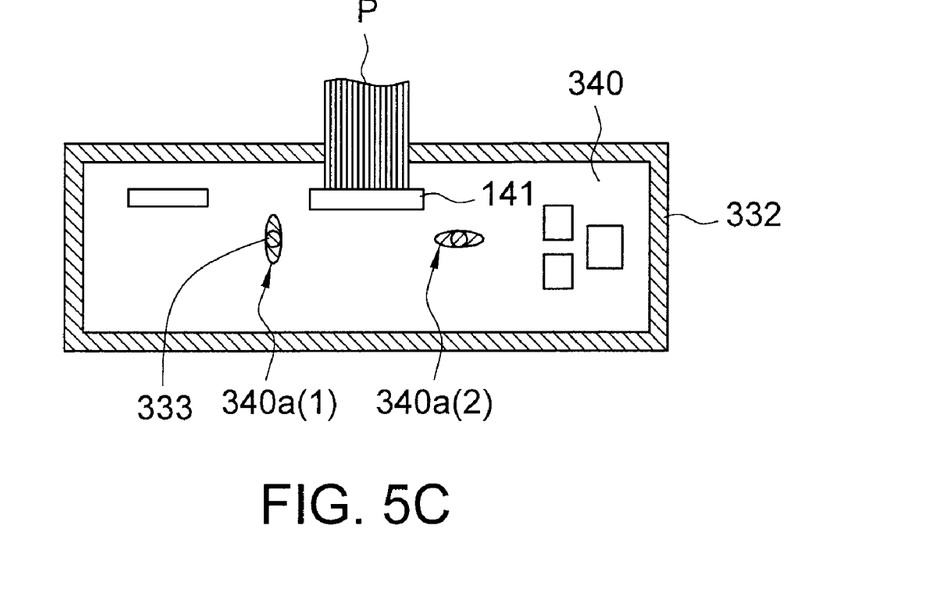
Figure 5D:
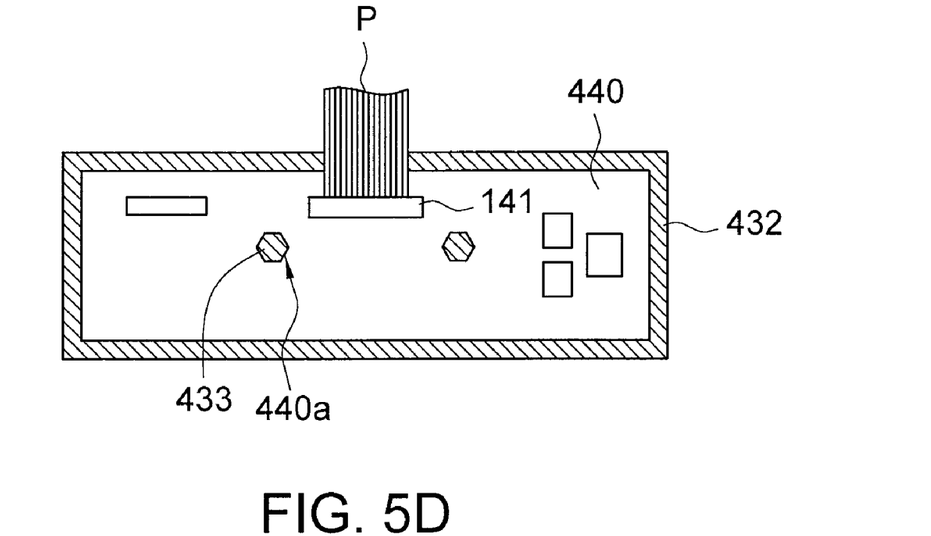

The number and position of the fixing columns 133 and the fixing holes 140a are not limited to any exemplification disclosed above and/or herein below. In FIGS. 5A~5D, various arrangements of the fixing column and the fixing hole are respectively shown. To avoid interfering with the cable P, the fixing hole 140a is located in some embodiments at the part of the circuit board 140 not covered by the cable P. As shown in FIG. 5A, four fixing holes 240a are disposed on the circuit board 240, and four fixing columns 233 are correspondingly disposed on the carrying portion 232. The fixing columns 233 and the fixing holes 240a are symmetrically disposed at the two sides of an imaginary extension of the cable P, for example. The fixing columns 233 and the fixing holes 240a, however, are located at one side of the connector 141 and the cable P is located at the other side of the connector 141. With such arrangement, an external force acting on the circuit board 240 and/or cable P is uniformly received by the circuit board 240, and the circuit board 240 will be unlikely bent or tilted. Moreover, as shown in FIG. 5B, two fixing holes 240a' are disposed on the circuit board 240', and two fixing columns 233' are disposed on the carrying portion 232'. The two fixing columns 233' and the two fixing holes 240a' are respectively disposed at the two sides of the cable P. The fixing columns 233 and the fixing holes 240a and the cable P are located at the same side of the connector 141. As shown in FIG. 5C, the circuit board 340 has at least two elongated fixing holes 340a(1) and 340a(2), and the carrying portion 332 correspondingly has at least two fixing columns 333. The elongated shape of the two fixing holes 340a(1) and 340a(2) is, in one or more embodiments, an ellipse, and the long (major) axis direction of the fixing hole 340a(1) is substantially perpendicular to the long axis direction of the other fixing hole 340a(2). The shape of the cross-section of the fixing column 333 is, in one or more embodiments, a circle a diameter of which is substantially equal to the short (minor) axis length of the ellipse fixing holes 340a(1) and 340a(2), so that the two fixing columns 333 will be respectively engaged with the two fixing holes 340a(1) and 340a(2) regardless of assembly tolerance, and the movement of the circuit board 340 is constrained in the long axis direction by fixing hole 340a(1) and in the transverse direction by fixing hole 340a(2). Or, as shown in FIG. 5D, the shapes of the fixing holes 440a of the circuit board 440 and the fixing columns 433 of the carrying portion 432 are corresponding polygons. In general, any number and/or shape of the fixing holes 140a and the fixing columns 133, as well as any configuration in which at least one fixing column 133 is engaged in at least one fixing hole 140a for fixing the circuit board 140 on the lamp cover 131 is within the scope of this disclosure.

Also, in a method of fixing the circuit board 140 of the backlight module 120 to the lamp cover 131 according to some embodiments, after the circuit board 140 and the fixing structure 130 have been provided, the fixing holes 140a are respectively engaged with the fixing columns 133 so as to fix the circuit board 140 on the outer surface 132a. Next, the circuit board 140 can further be fastened on the connecting surface 191 of the frame 190. Thus, movements of the circuit board 140 in the directions parallel to the outer surface 132a and perpendicular to the outer surface 132a are constrained. In some embodiments, the circuit board 140 can also be adhered to the connecting surface 191.

Second Configuration

The display device of the second configuration differs from the display device 100 (exemplarily shown in FIG. 2) of the first configuration mainly in the structure of the lamp cover, and the similarities are not repeated herein below.

Figure 6A:
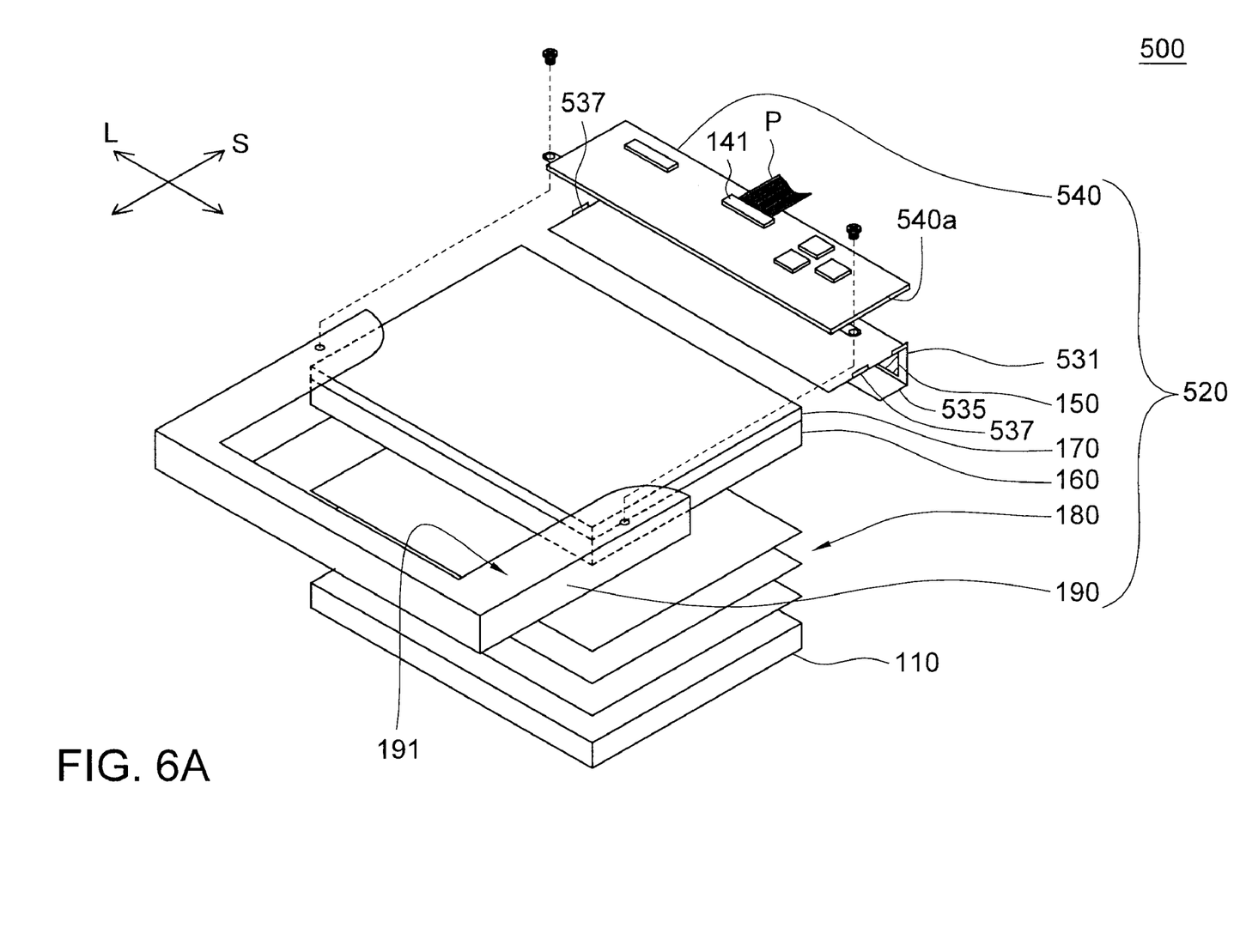
FIG. 6A shows an exploded, schematic, perspective view of a display device according to one or more embodiments.

In FIG. 6A, an exploded, schematic, perspective view of a display device according to the second configuration is shown. The display device 500 includes a display panel 110 and a backlight module 520 disposed at one side of the display panel 110. The backlight module 520 includes at least one light source 150, a lamp cover 531 and a circuit board 540. The lamp cover 531 has a containing portion 535 and at least one projection 537. The containing portion 535 is arranged for containing the light source 150. The projections 537 are located outside the containing portion 535. The circuit board 540 has at least one fixing portion 540a in contact with the projections 537 for constraining the movement of the circuit board 540. Besides, the circuit board 540 is connected to the display panel 110 through the flexible circuit board using COF technology.

In some embodiments, the lamp cover 531 has one or more projections 537 which can be integrally formed with the lamp cover 531 in one piece. The projections 537, disposed along a short side direction S of the backlight module 520, are respectively disposed at the two sides of the lamp cover 531, for example. The projections 537 are in contact with the fixing portion 540a so as to constrain the movement of the circuit board 540 in a long side direction L of the backlight module 520. The fixing portion 540a can be a contact plane, e.g., an edge, of the circuit board 540 that is parallel to the short side direction S as shown in FIG. 6A.

Figure 6B:
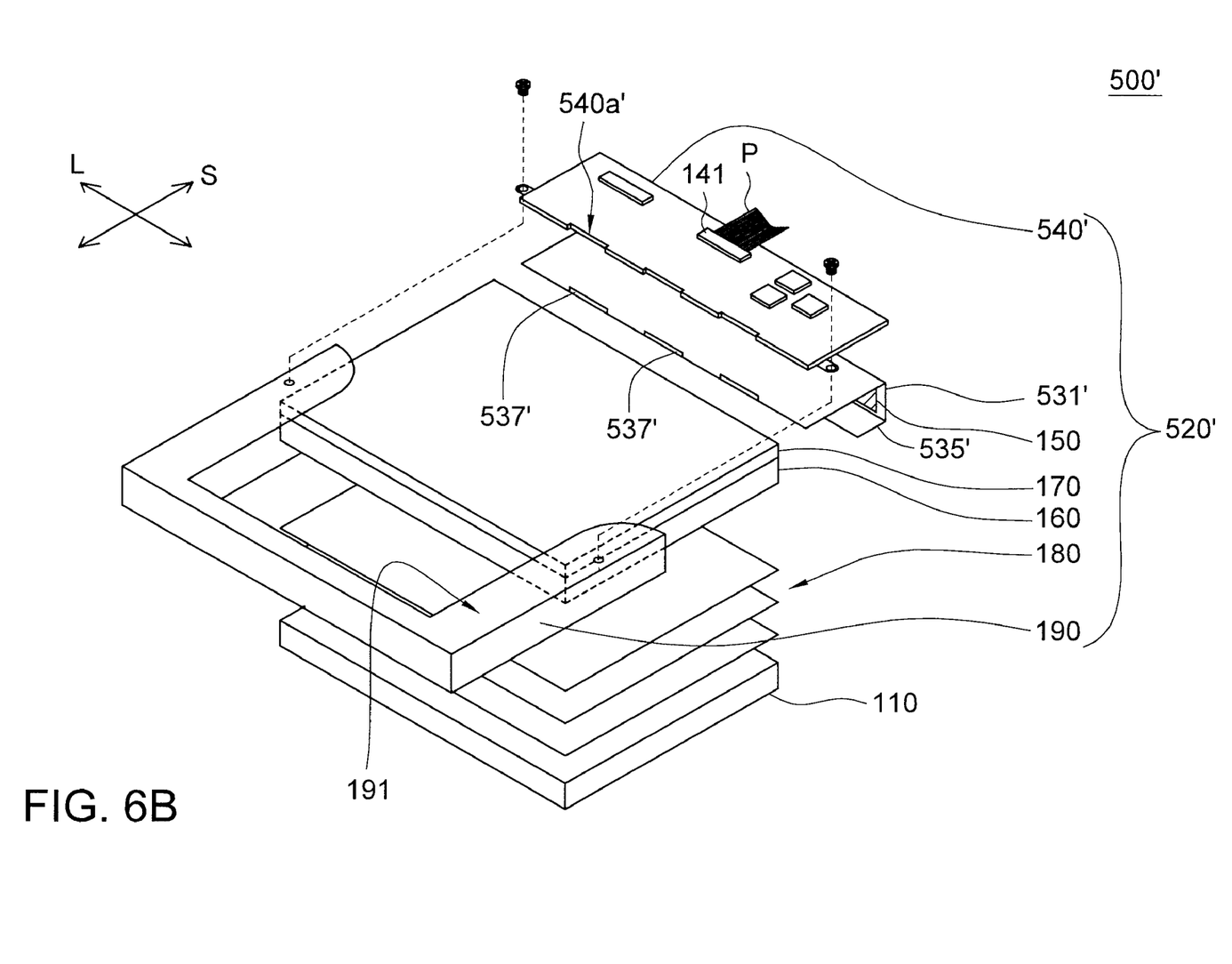
FIG. 6B shows an exploded, schematic, perspective view of a display device according to one or more embodiments.

In FIG. 6B, an exploded, schematic, perspective view of a display device according to one or more embodiments is shown. In the backlight module 520' of FIG. 6B, the lamp cover 531' has one or more projections 537' which are disposed along the long side direction L of the backlight module 520' and are further located at an edge of the lamp cover 531', for example. The edge is opposite to the cable P that is connected to the circuit board 540'. The projections 537' are in contact with the fixing portion 540a' so as to constrain the movement of the circuit board 540' in the short side direction S of the backlight module 520'. The fixing portion 540a' is, for example, at least one indentation located on the part of the circuit board 540' corresponding to the projections 537' as shown in FIG. 6B. Also, the terminal of at least one of the projections 537' can have a bending portion 539' for fixing the circuit board 540'.

The lamp cover 531 or 531' in some embodiments has both one or more projections 537 disposed along the short side direction S and one or more projections 537' disposed along the long side direction L, and the circuit board 540 correspondingly has both the fixing portion 540a being a contact plane, e.g., an edge, and the fixing portion 540a' being at least one indentation. Any position and/or any configuration of the fixing portion 540a, 540a' as well as the projections 537, 537' for fixing the circuit board 540 to the lamp cover 531, 531' are within the scope of this disclosure. In practical application, the fixing portion 540a being an indentation, for example, can be disposed at the lateral side of the circuit board 540 parallel to the long side direction L and/or the lateral side of the circuit board 540 parallel to the short side direction S.

Figure 7:
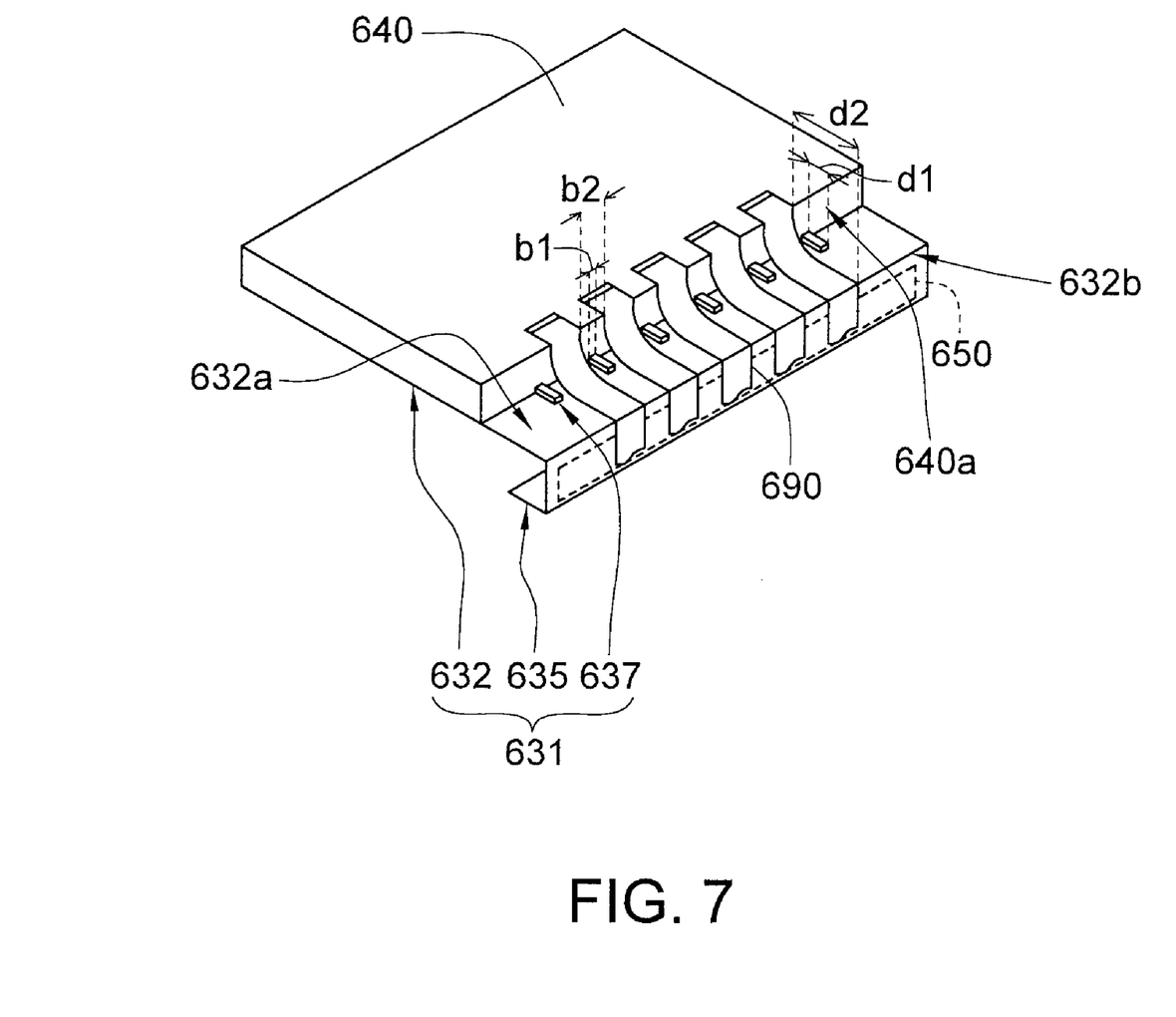
FIG. 7 shows a schematic, perspective view of a lamp cover according to one or more embodiments.

In the illustrated embodiment, the projections 537 are disposed at an edge of the lamp cover 531. However, the arrangement of the projections 537 is not limited to the above exemplification. In FIG. 7, a schematic, perspective view of a lamp cover 631 in some embodiments is shown. The lamp cover 631 has a carrying portion 632 in addition to the containing portion 635 and at least one projection 637. The containing portion 632 is arranged for containing the light source 650, and the projections 637 are located at an outer side of the containing portion 635. The projections 637 are located, in one or more embodiments, at an outer surface 632a of the carrying portion 632, and the circuit board 640 is fixed on the outer surface 632a. As shown in FIG. 7, the projections 637 are disposed on the outer surface 632a corresponding to the light source 650 and are adjacent to one side 632b of the carrying portion 632.

A plurality of connecting lines 690 are coupled to the circuit board 640, and there is a gap b2 between each pair of adjacent connecting lines 690. The width b1 of the projections 637 is, in some embodiments, smaller than or equal to the gap b2, so that the connecting lines 690 will not overlap the projections 637 or pressed by the projections 637. Besides, each connecting line 690 is extended from the circuit board 640 towards the side 632b of the outer surface 632a and covers the outer surface 632a for a length d2. The projections 637 have an extending length d1 in the direction parallel to each connecting line 690. The extending length d1 is substantially smaller than or equal to length d2. As shown in FIG. 7, the extending length d1 of each projections 637 is smaller than length d2, so that each connecting line 690 has sufficient length that can be extended to the side 632b from the circuit board 640 lest the connecting line 690 might not be dragged.

As shown in FIG. 7, the fixing portion 640a is a contact plane, e.g., an edge of the circuit board 640, and the projections 637 are one or more protrusions disposed on the outer surface 632a in contact with the contact plane for fixing the circuit board 640 on the outer surface 632a. Moreover, the connecting lines 690 are flexible printed circuit boards using COF technology.

Third Configuration

Figure 8A:
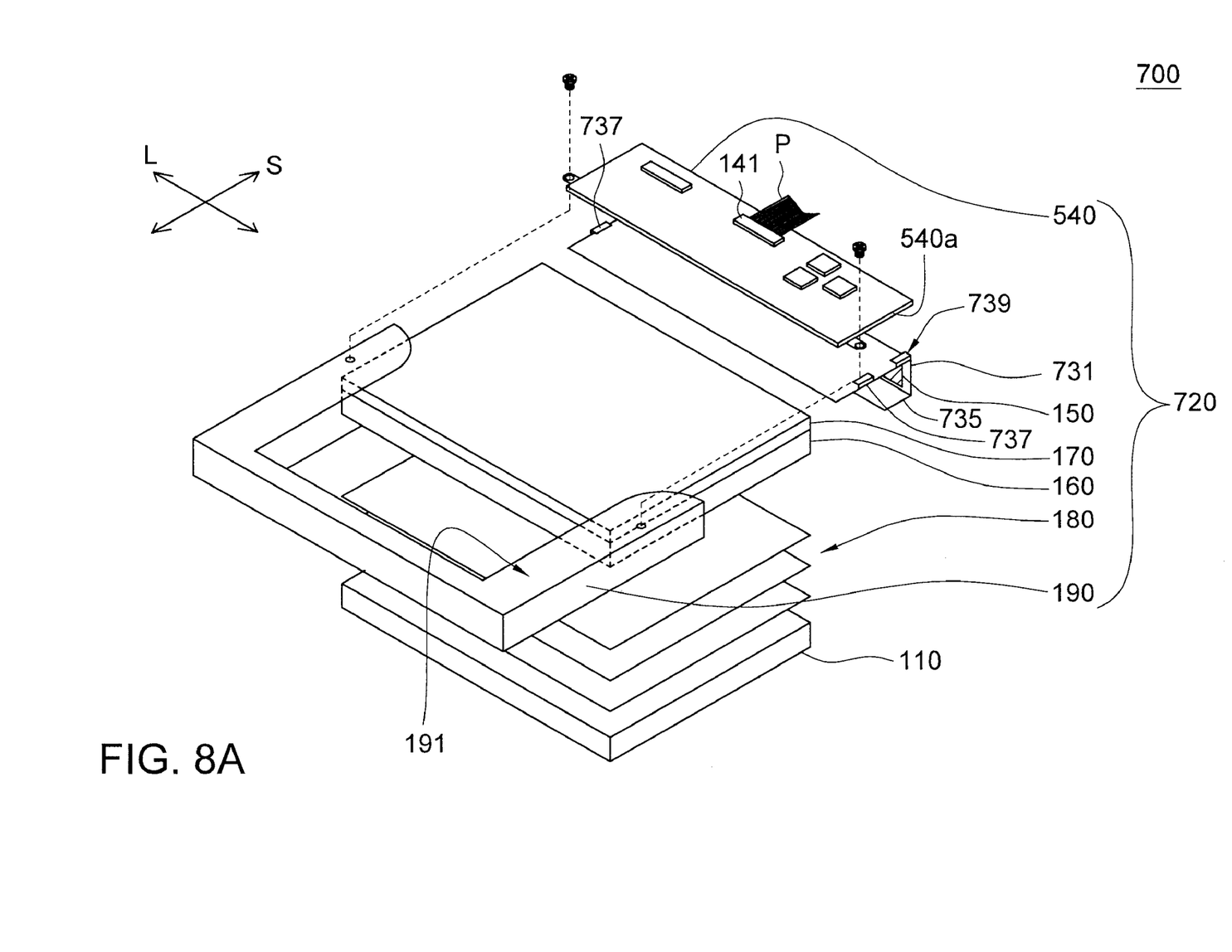
FIG. 8A shows an exploded, schematic, perspective view of a display device according to one or more embodiments.

The display device of the third configuration differs from the display device 500 (exemplarily shown in FIG. 6A) of the second configuration mainly in the structure of the projections, and other similarities are not repeated herein below. In FIG. 8A, an exploded, schematic, perspective view of a display device according to one or more embodiments of a third configuration is shown. The display device 700 includes a display panel 110 and a backlight module 720. The backlight module 720, disposed at one side of the display panel 110, includes at least one light source 150, a lamp cover 731 and a circuit board 540. In the illustrated embodiment, each of the projections 737 of the lamp cover 731 further has a bending portion 739 located at a terminal of the projection 737 for contacting the circuit board 540. In some embodiments, the bending portion 739 is parallel to the circuit board 540 so that the circuit board 540 is retained under the bending portion 739.

Figure 8B:
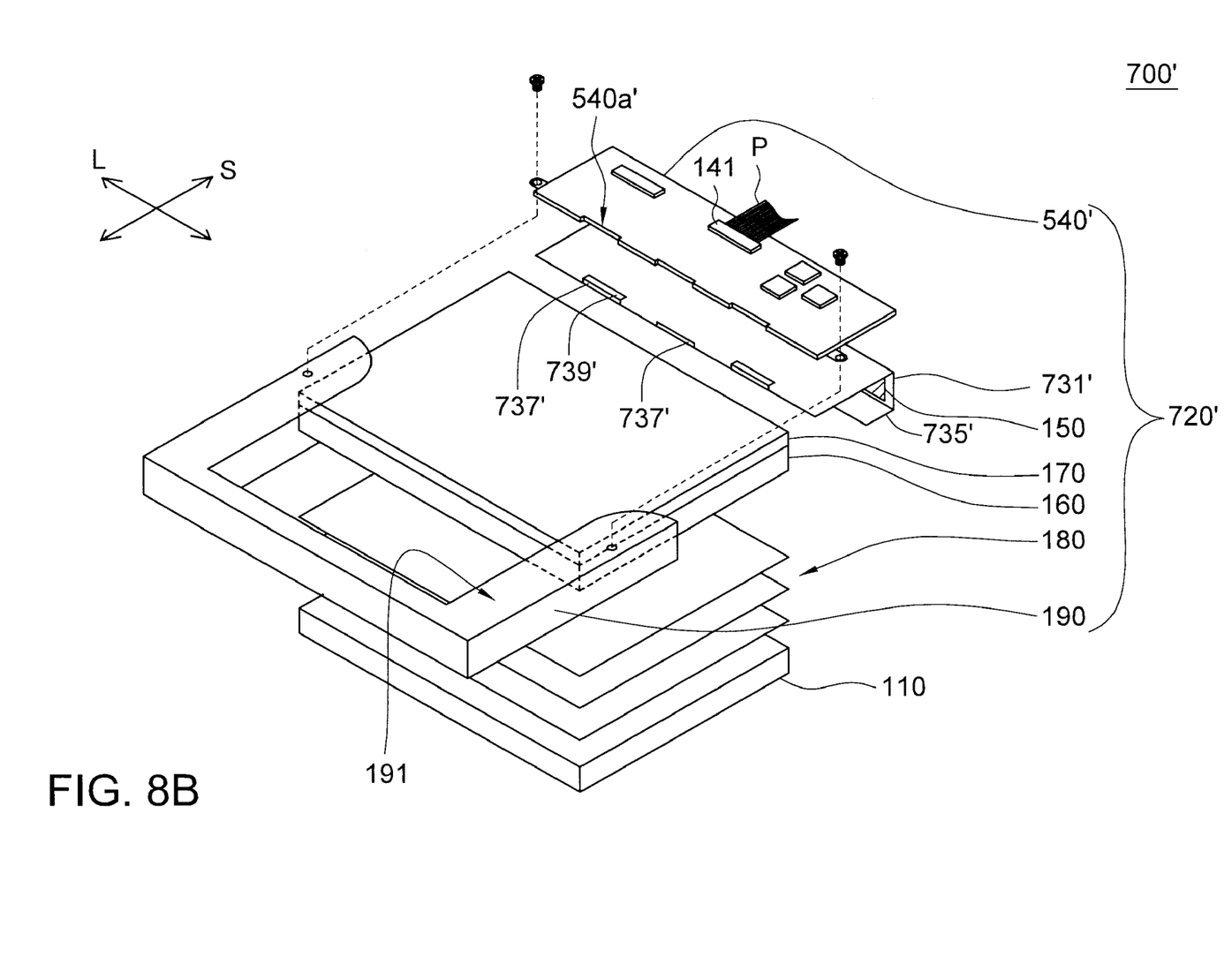
FIG. 8B shows an exploded, schematic, perspective view of a display device according to one or more embodiments.

In FIG. 8B, an exploded, schematic, perspective view of a display device in accordance with further embodiments is shown. In the backlight module 720', the lamp cover 731' has one or more projections 737' which are disposed along the long side direction L of the backlight module 720' and are further located at an edge of the lamp cover 731', for example. The projections 737' are in contact with the fixing portion 540a' for constraining the movement of the circuit board 540' in the short side direction S. As shown in FIG. 8B, the terminal of at least one of the projections 737' also has a bending portion 739' for constraining the movement of the circuit board 540 in the direction perpendicular to the display device. In a method of fixing a display device of the third configuration, e.g., the display device 700 of FIG. 8A, after the step of providing the lamp cover 731 and the step of providing the circuit board 540, the circuit board 540 is inserted under the bending portion 739 to cause the fixing portion 540a contact with the projections 737 and the bending portion 739, so that the circuit board 540 can be retained. Next, like the first configuration, the circuit board 540 is fastened on the connecting surface 191 of the frame 190.

The lamp cover 731 in some embodiments has one or more projections 737 and/or projections 737', the terminal of at least one of the projections 737 also has a bending portion 739, and/or the terminal of at least one of the projections 737' also has a bending portion 739'.

According to the display device and method of fixing a circuit board of a backlight module disclosed in the first, the second and the third configurations, the circuit board is firmly fixed on the lamp cover by the protrusion(s) of the lamp cover. The protrusion(s), such as a fixing column as disclosed with respect to the first configuration and/or a projection as disclosed with respect to the second and third configurations, is in contact with a fixing portion of the circuit board or engaged within a fixing hole of the circuit board. When the cable is plugged or unplugged, the circuit board will be unlikely moved and the connector will not be damaged easily. Besides, with the carrying portion having an area at least equal to that of the circuit board, the circuit board is evenly supported, the efficiency in heat dissipation of the circuit board and the light source is improved so that thermal defects are avoided, and the display quality and yield of the display device are increased.

While the disclosure has been described by way of example, it is to be understood that the disclosure should not be limited thereto. On the contrary, it is intended to encompass various modifications and similar arrangements and procedures.

What is claimed is:
1. A display device, comprising:
a display panel;
a circuit board electrically connected to the display panel and having at least one fixing portion; and
a backlight module disposed at one side of the display panel, wherein the backlight module comprises:
at least one light source;
a lamp cover having an inner surface and an outer surface, wherein the at least one light source is at least partially surrounded by the inner surface; and at least one protruding portion located at the outer surface and integrated with the lamp cover to serve as a fixing structure;

wherein the circuit board is disposed on the outer surface of the lamp cover; and the at least one protruding portion is in contact with the at least one fixing portion for constraining movements of the circuit board relative to the lamp cover.

2. The display device according to claim 1, wherein the at least one protruding portion comprises a plurality of projections disposed along at least one of a short side direction or a long side direction of the backlight module and in contact with the at least one fixing portion, for constraining movements of the circuit board in the other of the long side direction or the short side direction of the backlight module.

3. The display device according to claim 1, wherein the at least one fixing portion comprises at least one fixing hole in the circuit board in which the at least one protruding portion is received.

4. The display device according to claim 1, wherein a terminal of the at least one protruding portion has a bending portion contacting the circuit board from above for constraining movements of the circuit board in a direction normal to the outer surface of the lamp cover.

5. The display device according to claim 1, wherein the at least one protruding portion comprises a plurality of projections positioned on the outer surface of the lamp cover, inwardly from edges of the lamp cover, and in contact with a rear edge of the circuit board which defines the at least one fixing portion.

6. The display device according to claim 5, wherein the backlight module further comprises connecting lines coupled to the circuit board in a vicinity of the rear edge thereof;

the connecting lines and the projections are alternatingly arranged; and a width of each of the extending portions is smaller than a gap between adjacent two connecting lines.

7. The display device according to claim 1, wherein the at least one fixing portion comprises at least one of an edge of the circuit board against which the at least one protruding portion rests, or at least one indentation which is formed in the edge of the circuit board and in which the at least one protruding portion is at least partially received.

8. The display device according to claim 1, wherein the lamp cover further has at least a reflective piece located on the inner surface of the lamp cover and facing the at least one light source.

9. The display device according to claim 1, wherein the circuit board is entirely supported from below by a thermally conductive material of the lamp cover, thereby improving heat dissipation efficiency from the circuit board to an outside through the lamp cover.

10. The display device according to claim 1, wherein the backlight module further comprises:

a light guide plate disposed at one side of the lamp cover for receiving light emitted by the at least one light source and transmitting the received light to the display panel;

at least one optical sheet disposed between one side of the light guide plate and the display panel; and a reflector disposed at the other side of the light guide that is opposite to the optical sheet.

11. The display device according to claim 10, wherein the backlight module further comprises:

a frame at least partly surrounding the reflector and the light guide plate and having a connecting surface substantially parallel to the reflector, wherein the circuit board is fastened or adhered to the connecting surface.

12. A method of fixing a circuit board on a backlight module, the method comprising:

providing a lamp cover having at least one protruding portion and a containing portion, wherein the containing portion is arranged for containing, at an inner side thereof, at least one light source of the backlight module, and the at least one protruding portion is located at an outer side of the containing portion and integrated with the lamp cover to serve as a fixing structure;

providing at least one fixing portion on the circuit board; and placing the circuit board on the outer side of the containing portion so that the at least one fixing portion is in contact with the at least one the protruding portion to constrain movements of the circuit board relative to the lamp cover.

13. The fixing method according to claim 12, further comprising:

after said placing the circuit board on the outer side of the containing portion, fastening or adhering the circuit board to a frame of the backlight module.

14. The fixing method according to claim 12, wherein the at least one protruding portion comprises a plurality of projections disposed along at least one of a short side direction or a long side direction of the backlight module; and said placing comprises contacting the at least one fixing portion with the projections for and in contact with the at least one fixing portion, for constraining movements of the circuit board in the other of the long side direction or the short side direction of the backlight module.

15. The fixing method according to claim 12, wherein the at least one fixing portion comprises at least one fixing hole in the circuit board, and said placing comprises fitting the fixing hole over the at least one protruding portion.

16. The fixing method according to claim 12, wherein a terminal of the at least one protruding portion has a bending portion, and said placing comprises inserting the at least one fixing portion underneath the bending portion so that the bending portion retains the circuit board from moving upward and away from the containing portion.

17. A backlight module for a display device, said backlight module comprising:

at least one light source;

a lamp cover having an inner surface and an outer surface, wherein the at least one light source is at least partially surrounded by the inner surface;

at least one protruding portion located at the outer surface and integrated with the lamp cover to serve as a fixing structure; and a circuit board disposed on the outer surface of the lamp cover and having at least one fixing portion in contact with the at least one protruding portion which constrains movements of the circuit board relative to the lamp cover.

18. The backlight according to claim 17, wherein one of the at least one fixing portion and the at least one protruding portion defines a hole or a recess in which the other of the at least one fixing portion and the at least one protruding portion is received.

19. The backlight according to claim 17, wherein the circuit board is entirely supported from below by a thermally conductive material of the lamp cover, thereby improving heat dissipation efficiency from the circuit board to an outside through the lamp cover.

20. The backlight according to claim 17, further comprising:
a light guide plate disposed besides the lamp cover for receiving light emitted by the at least one light source;
a reflector disposed at a rear side of the light guide; and
a frame at least partly surrounding the reflector and the light guide plate and having a connecting surface substantially parallel to the reflector, wherein the circuit board is fastened or adhered to the connecting surface.

* * * * *